United States Patent [19]

Contiero et al.

[11] Patent Number: 5,610,421

[45] Date of Patent: Mar. 11, 1997

[54] INTEGRATED CIRCUIT WITH EPROM CELLS

[75] Inventors: Claudio Contiero, Buccinasco; Tiziana Cavioni; Stefano Manzini, both of Novara, all of Italy

[73] Assignee: SGS-Thomson Microelectronics S.r.l., Agrate Brianza, Italy

[21] Appl. No.: 358,152

[22] Filed: Dec. 15, 1994

[30] Foreign Application Priority Data

Dec. 15, 1993 [EP] European Pat. Off. .............. 93830505

[51] Int. Cl.⁶ ..................... H01L 27/06; H01L 27/115
[52] U.S. Cl. ..................... 257/321; 257/316; 257/378; 257/550
[58] Field of Search ..................... 257/314–322, 257/390–394, 910, 225, 239, 261, 268, 550, 378, 370

[56] References Cited

U.S. PATENT DOCUMENTS

| | | | |
|---|---|---|---|
| 4,586,238 | 5/1986 | Yatsuda et al. | 29/571 |
| 5,264,716 | 11/1993 | Kenney | 257/390 |
| 5,378,909 | 1/1995 | Chang et al. | 257/316 |
| 5,432,740 | 7/1995 | D'Arrigo et al. | 257/316 |

FOREIGN PATENT DOCUMENTS

| | | | |
|---|---|---|---|
| 0267882A1 | 5/1988 | European Pat. Off. | H01L 27/06 |
| 0403449A2 | 12/1990 | European Pat. Off. | H01L 27/06 |
| 0532481 | 3/1993 | European Pat. Off. | 257/577 |
| 1-140759 | 1/1989 | Japan | H01L 27/06 |
| 0094557 | 4/1990 | Japan | 257/577 |
| 3-105971 | 2/1991 | Japan | H01L 27/115 |

OTHER PUBLICATIONS

Ohzone et al., "An 8K × 8 Bit Static MOS RAM Fabricated by n–MOS/n–Well CMOS Technology," *IEEE Journal of Solid–State Circuits*, SC–15(5):pp. 854–861, Oct. 1980.

*Primary Examiner*—Robert P. Limanek
*Assistant Examiner*—Alexander Oscar Williams
*Attorney, Agent, or Firm*—David V. Carlson; Harry K. Ahn; Seed and Berry LLP

[57] ABSTRACT

An integrated circuit structure is disclosed wherein an EPROM cell has an active area formed by the same operations as are carried out to form a P region intended to contain an N-channel MOS transistor, source and drain regions formed by the same operations as are carried out to form the source and drain regions of said transistor, a control electrode consisting of an N+ region formed by the same operations as are carried out to form deep regions intended to contact buried N+ regions, and a floating gate electrode consisting of a layer of conductive material formed by the same operations as are carried out to form the gate electrodes of the MOS transistors in the integrated circuit.

The EPROM cell can, therefore, be formed in a mixed integrated circuit with no need for purposely added processing steps.

13 Claims, 4 Drawing Sheets

INTEGRATED CIRCUIT WITH EPROM CELLS

TECHNICAL FIELD

This invention relates to integrated circuits, and particularly to a monolithic integrated circuit including, at least one electrically programmable read-only non-volatile memory (EPROM, EEPROM) cell.

BACKGROUND OF THE INVENTION

Many industrial applications require complex electronic circuits to perform multiple functions which range from the processing of signals, whether in the analog, or the digital form, to the amplification of such signals and the generation of power signals for controlling and powering electric loads, e.g. motors, relays, lamps, etc. Certain applications involve data storage functions as well.

A trend toward ever more compact circuits has led to the development of processes for forming integrated circuits comprised of a large variety of electronic components, which may have even radically different structural and functional features, on a common substrate of semiconductor material. Thus, monolithic integrated structures comprising CMOS (Complementary Metal Oxide Semiconductor) circuits have been developed essentially for processing digital signals, as have bipolar circuits essentially for amplifying analog, signals, DMOS (Diffused Metal Oxide Semiconductor) power components, and bipolar power components for generating and controlling high voltages and large currents. For any data storage functions, however, the prior art provides external devices purposely designed and constructed to perform such functions. It is a widespread opinion among the designers of semiconductor devices that the manufacturing processes of storage devices are too fundamentally different from the manufacturing processes of so-called mixed integrated circuits of the type described above, and that while memory cells may be integrated, at least in theory, with mixed integrated circuits, this would involve in practice the addition of a number of processing steps to the already complicated manufacturing process, thereby making the process a highly critical one and the end product generally unreliable.

SUMMARY OF THE INVENTION

It is the object of this invention to provide for a monolithic integrated circuit structure comprising at least one programmable read-only memory (EPROM or EEPROM) cell to be formed by a manufacturing process of mixed integrated circuits with no processing steps specifically added or with the addition of few noncritical processing steps.

This object is achieved by an integrated circuit structure wherein the memory cell has its active area formed by the same operations as are carried out to form a P region for containing, an N-channel MOS transistor, its source and drain regions formed by the same operations as are carried out to form the source and drain regions of the transistor, its control electrode provided by an N+ region formed by the same operations as are carried out to form deep regions intended for contacting buried N+ regions, and a floating gate electrode comprising a conductive material layer formed by the same operations as are carried out to form the gate electrodes of the MOS transistors in the integrated circuit.

The invention and its advantages can be more clearly understood by having reference to the following detailed description of various embodiments thereof, given by way of example and not of limitation in connection with the accompanying drawings.

DETAILED DESCRIPTION OF THE INVENTION

Figure 1:
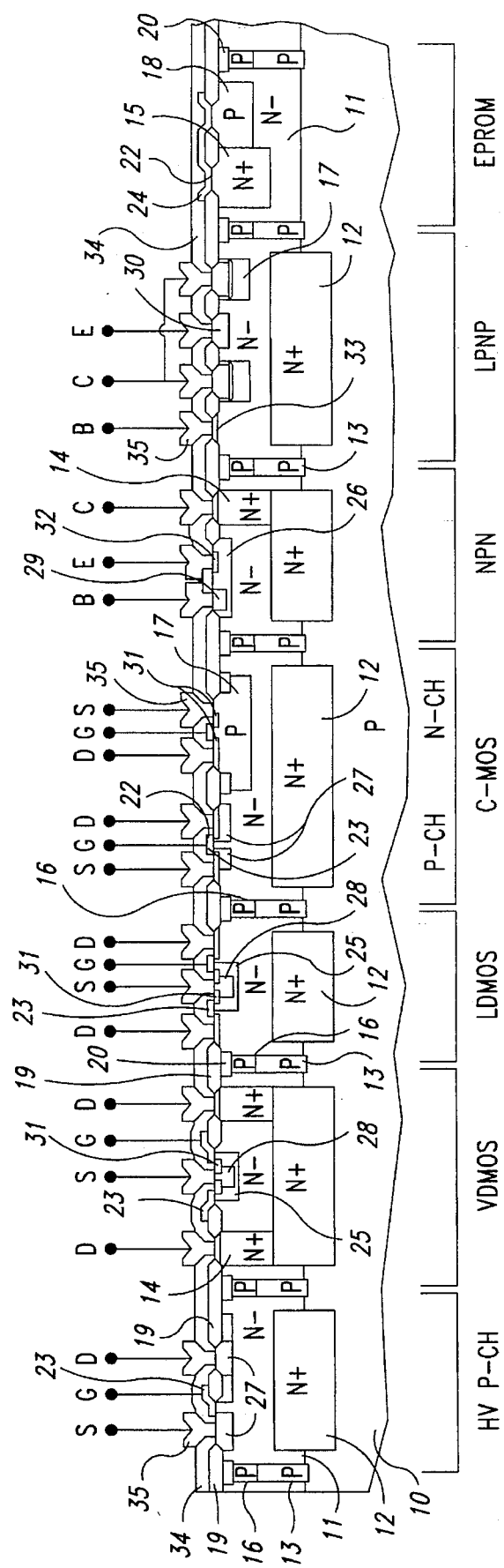
FIG. 1 is a sectional view showing schematically a structure according to the invention, with an EPROM cell and some components obtained by a manufacturing process of a mixed integrated circuit.

Shown in FIG. 1 are some of the principal components of a mixed integrated circuit. These are identified by the following abbreviations:

HVP-CH = a high-voltage P-channel MOS transistor,

VDMOS = a vertical conduction power transistor,

LDMOS = a horizontal conduction power MOS transistor,

CMOS = a pair of complementary MOS transistors, namely a P-channel (P-CH) transistor and an N-channel (N-CH) transistor, NPN = a vertical conduction bipolar transistor of the NPN type, LPNP = a lateral, i.e. horizontal conduction, bipolar transistor of the PNP type, and EPROM = an electrically programmable read-only memory cell.

In the drawing figure, the electrodes of the various components are identified as follows:

S = Source,

D = Drain,

G = Gate,

E = Emitter,

B = Base,

C = Collector.

The main process steps for forming the structure of FIG. 1 are well known in the art and are briefly summarized herein below with reference to FIG. 1.

1. Impurities of the N type are implanted in some selected areas and impurities of the P type are implanted in some other selected areas of a substrate 10, of monocrystalline silicon of the P type.

2. A layer of N- silicon 11, is formed by epitaxial growth at a high temperature over the substrate 10; during this step, the impurities of the N and P types implanted during the preceding step will diffuse to form buried N+ regions 12, and deep isolation P regions 13.

3. Deep N+ regions 14, are formed by implantation and subsequent diffusion which extend from the front surface of the structure into the N-epitaxial layer 11 to contact with some of the N+ buried regions 12, namely the drain region of the VDMOS transistor and buried collector region of the NPN transistor; during the same step, the region 15 is formed which constitutes the control electrode of the EPROM cell.

4. Formed by implantation followed by diffusion, are intermediate isolation regions 16, the so-called P-well region 17, for containing, the N-channel transistor of the CMOS pair, the collector region of the lateral bipolar LPNP transistor 17', and the region 18, which is intended to contain the active area of the EPROM cell.

5. The surface areas to be isolated from one another are defined using a LOCOS technique of local oxide growth.

6. Impurities of the P and N types are implanted in selected areas of the epitaxial layer 11.

7. Silicon dioxide regions 19, are grown at a high temperature by the LOCOS technique to isolate the previously defined areas from one another; during this step, P regions 20, are formed by diffusion of the impurities implanted during the preceding step, which completes the isolation regions by delimiting portions of the N-epitaxial layer 11 therein.

8. Thin layers, indicated at 22, of silicon dioxide are formed over those areas which define the channels of the MOS transistors, including the EPROM cell channel, and the isolation layer between the floating gate 24 and the control electrode 15 of the EPROM cell is also formed.

9. Impurities of the P type are implanted in the channel areas of the P-channel transistors of the CMOS pairs to bring down their conduction thresholds.

10. Formed from a previously deposited layer of polycrystalline silicon are the gate electrodes, indicated at 23, of the MOS transistors, the floating gate electrode, indicated at 24, of the EPROM cell, and interconnection paths, not shown, for connecting together the various components.

11. Formed, as by implantation followed by diffusion, are additional so-called body regions of the P type, indicated at 25, of the VDMOS and LDMOS transistors, as well as the base region, indicated at 26, of the vertical NPN bipolar transistor.

12. The source and drain P+ regions, indicated at 27, of the transistor HVP-CH and the P-channel transistor in the CMOS pair, P+ body surface enhancement regions 28 of the VDMOS and LDMOS transistors, base contact region 29 of the NPN bipolar transistor, and emitter region 30 of the LPNP lateral bipolar transistor are formed.

13. The N+ source regions, indicated at 31, of the VDMOS and LDMOS transistors, source and drain regions 31 of the transistor N-CH in the CMOS pair and the EPROM cell, N+ emitter region, indicated at 32, of the NPN transistor, and N+ base contact region 33 of the LPNP transistor are formed.

14. An insulating layer 34 is formed through which apertures are opened in selected areas for the ohmic contact of the various components.

15. Formed from a metallic layer previously deposited over the insulating layer 34 are ohmic contacts 35 in the selected contact areas, including that for the control electrode 15 of the EPROM cell, and electric connection paths, not shown, between components of the circuit.

Figure 2:
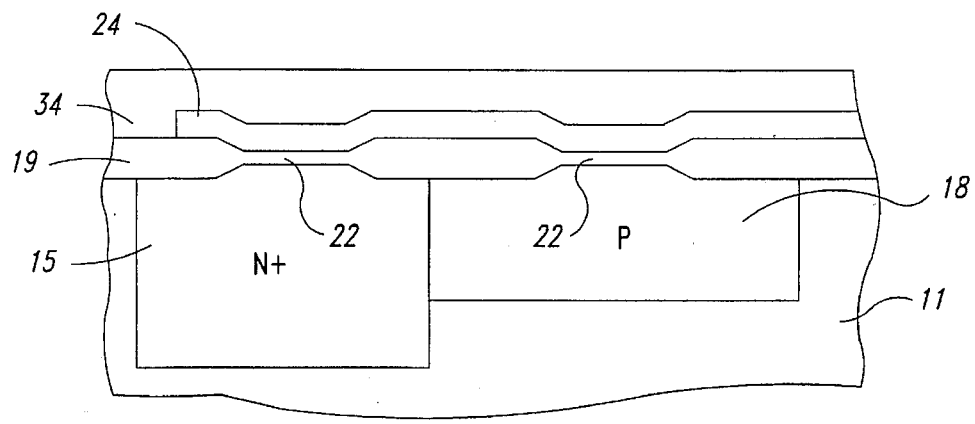
FIG. 2 is an enlarged sectional view of the EPROM cell shown in FIG. 1.
Figure 3:
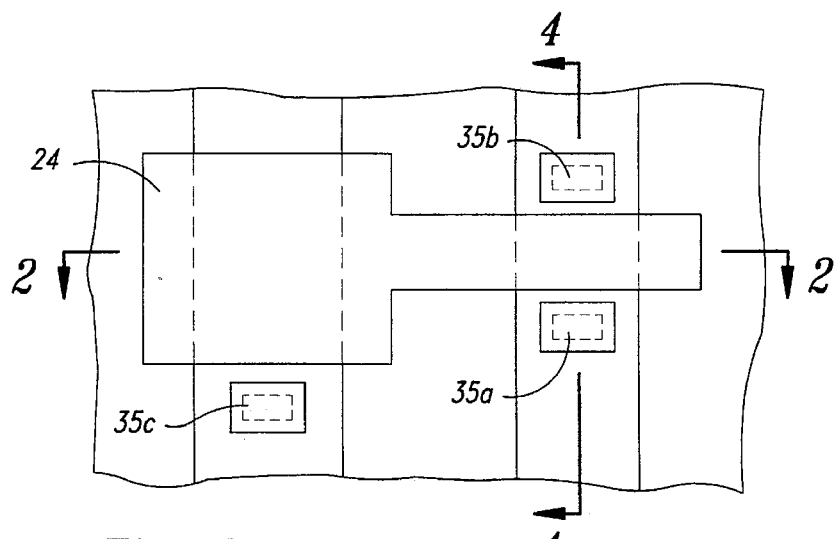
FIG. 3 is a plan view of the EPROM cell in FIG. 2.
Figure 4:
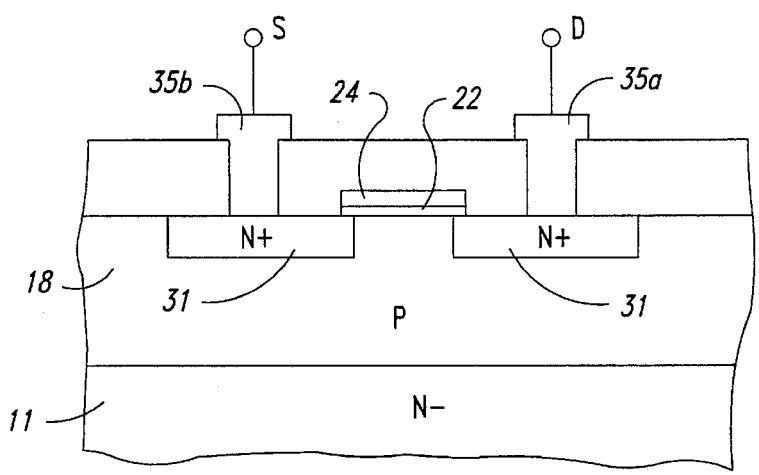
FIG. 4 is a sectional view of the EPROM cell taken along line IV—IV in FIG. 3.

As can be seen, in particular from FIGS. 2, 3 and 4, the EPROM cell yielded by the process just described is a cell with a single layer of polycrystalline silicon 24 and a control gate or control electrode 15 diffused through the epitaxial layer 11. The floating gate 24, formed from the polysilicon layer, is coupled capacitively to both the control electrode 15 and the active area between the source and drain regions 31, i.e. to the channel of the cell. The cell terminals comprise ohmic contacts for the source and drain 35a, 35b and control 35c electrodes (FIGS. 3 and 4). The cell is conventionally programmed by applying a high voltage (10 to 15 V) to the drain and control electrodes relative to the source electrode and the channel region, to thereby establish a flow of electric charges (hot electrons) from the channel to the floating gate 24 through the gate oxide 22. The floating gate 24, once charged, will alter the conduction threshold of the MOS transistor of the cell, that is the minimum source-drain voltage which admits an appreciable current flow through the channel. There are two possible threshold levels of the transistor, corresponding to a state of absence or presence of charges on the floating gate, which define the 0 or 1 logic levels of the cell. The cell state is detected, i.e., the memory cell read, by applying a low voltage (4 to 5 V) to the drain and control electrodes relative to the source and measuring the current that flows through the channel. Since the gate 24 is fully isolated electrically, its charge state will not change during normal read operations, that is the cell will behave as a read-only memory (ROM) cell. Where necessary, this cell type can be erased, as is known, by exposure to ultraviolet (UV) radiation. For this purpose, a transparent window to this radiation would have to be provided in the structure containing the integrated circuit with the EPROM cell.

The number of EPROM cells formed will obviously depend on individual circuit requirements for storage. The cells may be arrayed across a single N+ region constituting the control electrode common to all the cells, or be arranged otherwise across the various side-by-side N+ regions to form a matrix of cells.

Figure 5:
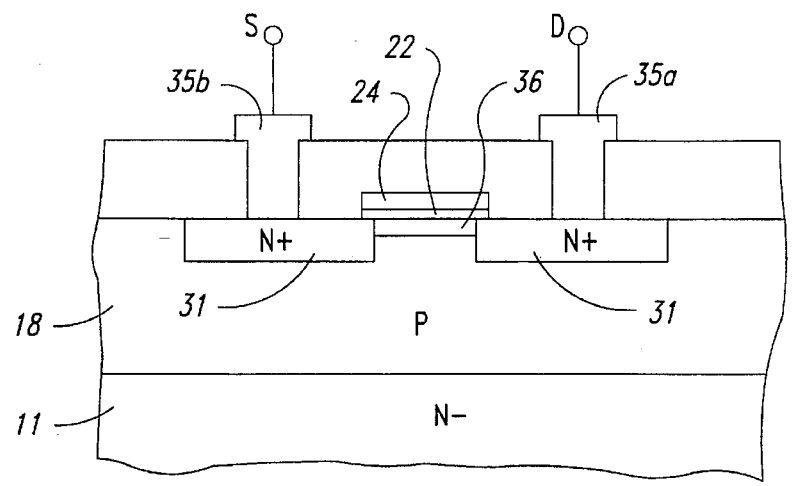
FIGS. 5 and 6 are sectional views similar to FIG. 4 but showing alternative embodiments of the EPROM cell of FIG. 4.
Figure 6:
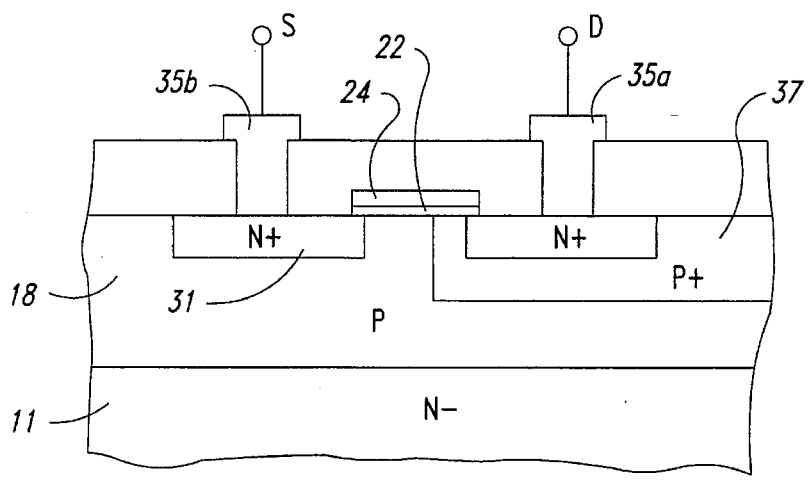

It is a recognized fact that the programming speed of an EPROM cell is substantially affected by the concentration of impurities in the channel. When the channel is formed from a region with a low impurity concentration, a special surface enhancement operation is resorted to. In the instance of the inventive structure, this enhancement is advantageously obtained by utilizing the same process step wherein P impurities are implanted in the channels of the P-channel transistors of the CMOS pairs (Step 9 of the process described hereinabove), or utilizing the same process step as provided for forming the body regions of the VDMOS and LDMOS transistors (Step 11 of the process described hereinabove). Cross-sectional views of the cell structure in accordance with these two alternative embodiments, are shown in FIGS. 5 and 6, where the enhanced region according to the first alternative embodiment is indicated at 36, and that according to the second alternative embodiment is indicated at 37.

As can be seen in the embodiments of the invention described above, the EPROM cells may be formed in the structure itself of the mixed integrated circuit with no need for additional operations.

Figure 7:
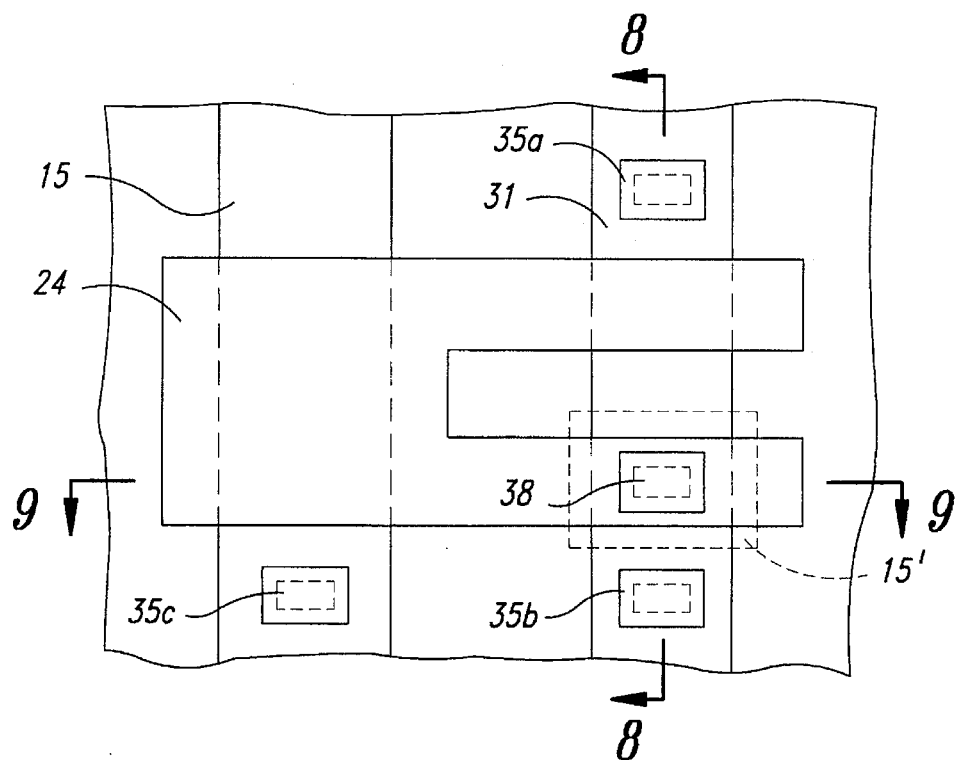
FIG. 7 is a plan view of an EEPROM cell according to another embodiment of the invention.

In another embodiment of the invention, a type of EPROM called electrically erasable programmable read-only memory (EEPROM) cells may also be formed in the same structure, alternatively or in combination with the EPROM cells. In this case, an N+ region, shown at 15, in FIGS. 7 to 9, should be formed which may be termed an injection region and would be isolated from the control electrode region 15. That region 15' is preferably formed in the active area of the cell by the same operation as detailed under 3. of the description of the manufacturing process previously provided whereby N+ deep regions are formed. Then, by a single additional operation, a depressed area 38 is formed in the insulating layer 22 which extends across the injection region 15'. That layer of reduced thickness can be obtained by opening a small aperture through the thin layer 22 of silicon dioxide during the gate isolation layer forming step and growing a very thin (8–10 nm as against the 50–60 nm of the gate isolator) layer of silicon dioxide over the exposed surface of the injection region. A flow of charges will occur in a known manner by tunneling effect through that layer as the cell electrodes are suitably polarized.

Figure 8:
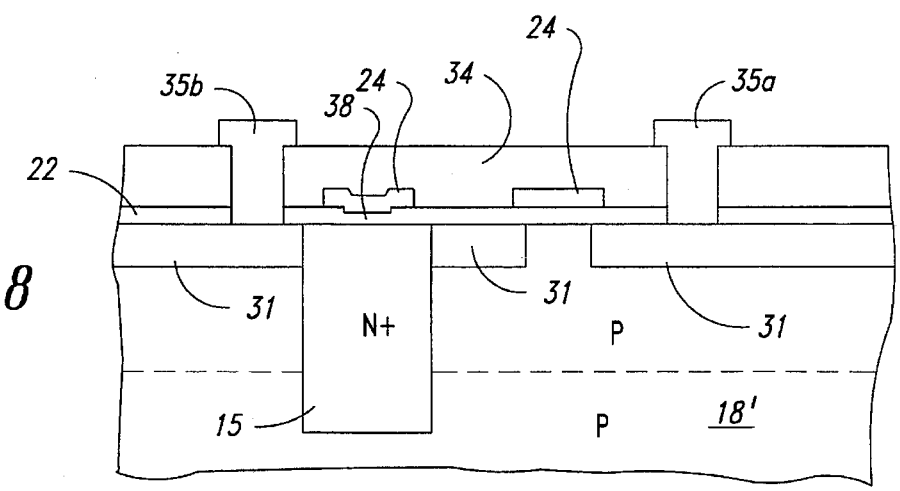
FIGS. 8 and 9 are sectional views of the EEPROM cell in FIG. 7 taken along lines VIII—VIII and IX—IX, respectively.
Figure 9:
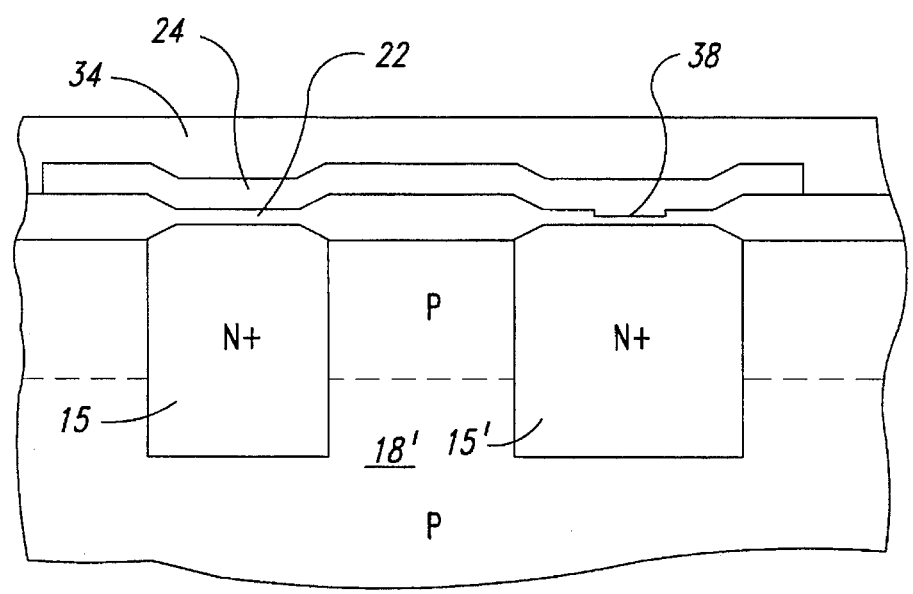

A method of isolating the injection region 15' from the control electrode region 15 would consist of forming a P region adapted to contain both said regions 15 and 15'. Advantageously, this containing region, shown at 18' in FIGS. 8 and 9, is formed by two P regions similar to those provided in Steps 2., 3 and 4 of the process described above for forming the isolation regions.

This isolation method may also be practiced where EPROM cells are to be isolated.

In another alternative embodiment of the invention, particularly where the structure of the integrated circuit includes components that require strongly doped but relatively thin N+ regions, i.e. regions significantly less deep than the contact regions 14 of the buried regions 12, the region which functions as control electrode and the injection region are advantageously formed of two such relatively thin N+ regions. In this way, cells can be obtained which are more compact in size than the cells according to the first embodiment of the invention.

We claim:

1. A monolithic integrated circuit structure having at least one electrically programmable read-only memory cell, the circuit structure being formed on a chip of semiconductor material having a front surface and including a substrate of the P type and an N− layer overlying the P substrate, the monolithic integrated circuit structure comprising:

a plurality of buried N+ regions disposed between the P substrate and the N− layer;

a plurality of deep N+ regions extending from the front surface into the N− layer and having substantially the same depth and doping concentration profile, a first of said plurality of deep N+ regions extending sufficiently deep to contact one of said plurality of buried N+ regions;

a plurality of P regions extending from the front surface into the N− layer;

a plurality of thin N+ regions providing source and drain regions for MOS transistors and extending from the front surface into at least some of the P regions;

a plurality of thin isolating layers disposed over selected portions of the front surface and adapted to provide gate isolation for MOS transistors;

a plurality of conductive material layers extending over the thin isolating layers and adapted to provide gate electrodes for MOS transistors; and a plurality of electric connection metallic layers extending across the front surface and being isolated from each other by a layer of an insulating material and being in ohmic contact with selected areas of said deep N+ regions and said thin N+ regions;

the memory cell having:

one of said P regions acting as an active area, a pair of said thin N+ regions disposed in said active area acting as source and drain N+ regions, one of said deep N+ regions being positioned as a control electrode, said one of said deep N+ regions having substantially the same depth and doping concentration profile as the other deep N+ regions, and one of said conductive material layers acting as a floating gate electrode, said floating gate electrode extending over a portion of the active area between the source and drain N+ regions which forms a cell channel, isolated therefrom by one of said thin isolating layers, said floating gate electrode also extending over a selected area of the deep N+ region which forms the control electrode and separated therefrom by one of said thin isolating layers.

2. The structure according to claim 1, further comprising areas of the N− layer which are enhanced with impurities of the P type, and the portion of the active area which is included between the source and drain regions and which constitutes the channel of the memory cell is enhanced with impurities of P type during the same process step wherein said enhanced areas of the N− layer are formed.

3. The structure according to claim 1, further comprising additional P regions extending from the front surface into the N− layer to a shallower depth than said P regions and having a higher concentration of impurities than said P regions, and the memory cell includes one of said additional P regions in a portion of the active area which includes the drain region and at least part of the channel.

4. The structure according to claim 1 wherein the memory cell further comprises an injection N+ region underlying a selected area of the floating gate electrode, said injection region being formed of one of said deep N+ regions which is electrically isolated from the N+ region which constitutes the control electrode, and that the thin insulating layer which separates the floating gate electrode of the memory cell from the control electrode extends over said injection region to a reduced thickness effective to admit a charge flow by tunneling effect between the floating gate electrode and said injection region.

5. The structure according to claim 4, further comprising a plurality of isolation P regions extending from the front surface of the N− layer to the substrate such that portions of the N− layer are delimited on their interiors and being each formed of one of said P regions and a deep isolation region which extends to the substrate, and that the memory cell has a containing P region which contains the two N+ regions forming the control electrode and injection region and comprises P regions similar to the isolation regions.

6. The structure according to claim 1, further comprising a plurality of isolation P regions extending from the front surface of the N− layer to the substrate such as to delimit portions of the N− layer on their interiors and being each formed of one of said P regions and a deep isolation region which extends to the substrate, and that the memory cell has a containing P region which contains the region forming the control electrode and comprises P regions similar to the isolation regions.

7. A semiconductor structure containing an electrically programmable read-only memory cell, the semiconductor structure comprising:

a substrate;

a first region overlying the substrate, the first region being of the opposite conductivity type from the substrate;

a second region of the same conductivity type as the substrate, the second region extending into the first region;

a plurality of buried regions of the opposite conductivity type from the substrate, the buried regions being disposed between the substrate and the first region;

a plurality of deep regions of the same conductivity type as the buried regions, the deep regions extending into the first region and some of the deep regions contacting the buried regions, one of the deep regions defining a control electrode of the memory cell and all of the deep regions having substantially the same depth;

two thin regions of the opposite conductivity type from the second region, the two thin regions extending into the second region, the two thin regions defining source and drain regions of the memory cell, a region between the two thin regions defining an active area of the memory cell;

a conductive layer extending over a selected portion of the active area that forms a cell channel and over a selected portion of the control electrode, the conductive layer defining a floating gate of the memory cell for storing electrical charge; and a thin insulating layer disposed between the conductive layer and the active area, and between the conductive layer and the control electrode so that the insulating layer insulates the conductive layer from the control electrode and from the active area that forms the cell channel.

8. The semiconductor structure according to claim 7 wherein the substrate is of P type, the deep regions are of N+ type, the first region is an epitaxial layer of N– type, the second region is of P type and the two thin regions are of N+ type.

9. The semiconductor structure according to claim 7, further comprising an enhanced region within the active area that forms the cell channel, the enhanced region being enhanced with the same impurity type as the second region for faster programming of the memory cell.

10. The semiconductor structure according to claim 7, further comprising a third region of the same conductivity type as the second region, the third region being disposed within the second region and extending into the second region, wherein one of the two thin regions is disposed within the third region, the third region including at least a portion of the active area that forms the cell channel, and having a higher concentration of impurities of the third region conductivity type than the second region for faster programming of the memory cell.

11. The semiconductor structure according to claim 7 wherein one other of the deep regions defines an injection region of the memory cell, the injection region underlying a selected area of the conductive layer and being electrically isolated from the control electrode, the thin insulating layer extending over the injection region, the thickness of the thin insulating layer overlying the injection region being sufficiently reduced to admit a charge flow by tunneling effect between the conductive layer and the injection region.

12. The semiconductor structure according to claim 7 wherein the memory cell is disposed within a mixed integrated circuit structure.

13. The semiconductor structure according to claim 8, further comprising a second deep region of the same conductivity type as the substrate extending into the substrate, the second deep region for electrically isolating the memory cell from adjacent circuit elements within the semiconductor structure.

* * * * *